United States Patent [19]
Okuda et al.

[11] Patent Number: 5,788,773
[45] Date of Patent: Aug. 4, 1998

[54] SUBSTRATE SPIN TREATING METHOD AND APPARATUS

[75] Inventors: Seiichiro Okuda; Kenji Sugimoto; Hiroshi Yoshii, all of Kyoto, Japan

[73] Assignee: Dainippon Screen Mfg. Co., Ltd., Japan

[21] Appl. No.: 731,245

[22] Filed: Oct. 11, 1996

[30] Foreign Application Priority Data

Oct. 25, 1995 [JP] Japan .................................. 7-302061
Dec. 29, 1995 [JP] Japan .................................. 7-353151

[51] Int. Cl.$^6$ .................................. B05B 13/04; B08B 3/00
[52] U.S. Cl. .................................. 118/319; 118/320; 118/52; 134/902; 134/154; 134/153
[58] Field of Search .................................. 118/319, 320, 118/52, 304; 134/149, 153, 902, 182; 239/524, 518, 499

[56] References Cited

FOREIGN PATENT DOCUMENTS 3136232  6/1991  Japan .

Primary Examiner—Laura Edwards
Assistant Examiner—Calvin Padgett
Attorney, Agent, or Firm—Ostrolenk, Faber, Gerb & Soffen, LLP

[57] ABSTRACT

A baffle is placed in a position opposed to discharge openings of a treating solution supply nozzle and between the discharge openings and the surface of a substrate. The baffle intercepts a treating solution discharged from the discharge openings, whereby the treating solution is supplied evenly to the surface of the substrate by flowing over a surface of the baffle and falling from an edge of the baffle to the substrate, instead of falling from the discharge openings directly to the substrate. No microbubbles are formed in the treating solution on the substrate, which would cause an unevenness of treatment. The discharge openings may be defined by a plurality of circular bores formed in the supply nozzle. Each circular bore may have a diameter at least equal to a spacing between an adjacent pair of circular bores.

13 Claims, 7 Drawing Sheets

SUBSTRATE SPIN TREATING METHOD AND APPARATUS

BACKGROUND OF THE INVENTION

(1) Field of the Invention

This invention relates to substrate spin treating methods and apparatus such as spin developers (rotary developing apparatus) for treating substrates by supplying a treating solution such as a developing solution to the surface of a substrate supported in a horizontal position and spun about a vertical axis. More particularly, the invention relates to a technique of improving a treating solution supplying device for supplying a treating solution to the surface of a substrate.

(2) Description of the Related Art

Figure 1:
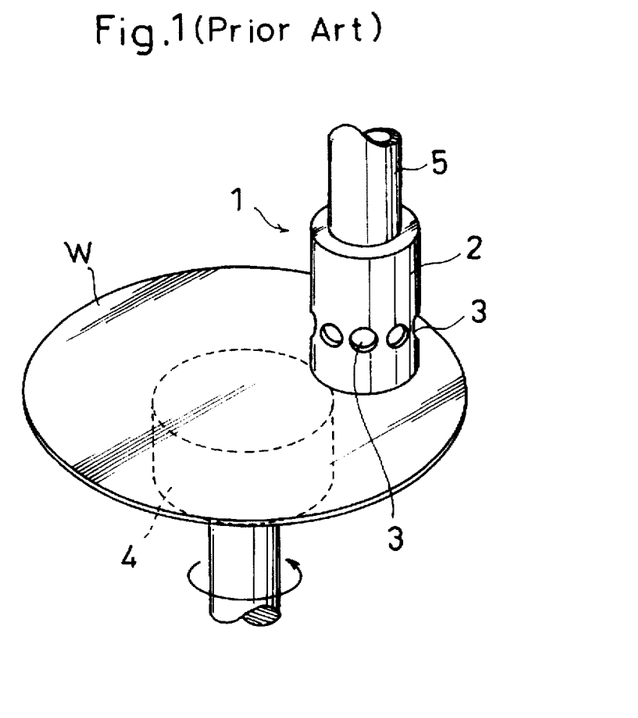
FIG. 1 is a perspective view of a developing solution supply nozzle in a conventional spin developer.

For a substrate spin treating apparatus, such as a spin developer used as a semiconductor manufacturing apparatus, various types of developing solution supply nozzles have been proposed to supply a developing solution as uniformly as possible over the entire surface of a spinning substrate. FIG. 1 shows one example of a developing solution supply nozzle proposed heretofore. The illustrated nozzle 1 includes a tubular body 2 maintained in a vertical position and having a distal end that is closed to reverse the flow of the developing solution in the tubular body 2. The tubular body 2 has a plurality of discharge bores 3 formed circumferentially in a side wall thereof adjacent the lower end. When supplying the developing solution, a nozzle moving device, not shown, moves the developing solution supply nozzle 1 to a position above a substrate or wafer W supported in a horizontal position on a spin chuck 4. In this position, the lower end of the tubular body 2 lies close to the surface of wafer W. Then, the developing solution is delivered through a solution supply pipe into the tubular body 2. The developing solution collides with a bottom inner wall of the tubular body 2 to lose some of its velocity, and is discharged horizontally through the discharge bores 3 formed in the side wall. Thus, the developing solution flows out radially toward the center and peripheral regions of wafer W to be supplied to the surface of wafer W. The developing solution is spread over the entire surface of wafer W by the spin of wafer W.

The developing solution supply nozzle 1, shown in FIG. 1, supplies the developing solution through the discharge bores 3 to discrete spots onto the wafer W. The developing solution is the spread over the entire surface of wafer W by the spin of wafer W. Consequently, an unevenness in developing could occur between parts of the surface of wafer W initially contacting the developing solution and the other parts of the surface. In addition, the developing solution supply pipe 5 includes bends. Because of such bends, the velocity of the developing solution flowing through the pipe varies among different positions transversely of the pipe, before the solution reaches the supply nozzle 1. The variations in the flow velocity among positions in the passage result in variations in the flow velocity of the developing solution discharged through the discharge bores 3 formed circumferentially of the tubular body 2. This causes instability in the balance of the developing solution discharged through the discharge bores 3 of the developing solution supply nozzle 1, leading to an unevenness of treatment such as an unevenness in developing the surface of wafer W. Furthermore, air may be trapped in the developing solution settling on the surface of wafer W after exiting the discharge bores 3 of the developing solution supply nozzle 1. Nitrogen dissolved in the developing solution may turn into fine bubbles. Such air and nitrogen form what is called microbubbles in developing solution. Defective development results from the microbubbles in the developing solution covering the surface of wafer W.

SUMMARY OF THE INVENTION

This invention has been made having regard to the state of the art noted above, and its primary object is to provide a substrate spin treating method and apparatus for supplying a treating solution from a treating solution supply nozzle evenly over the surface of a substrate to preclude unevenness in treatment, such a unevenness in development.

Another object of the invention is to provide a substrate spin treating method and apparatus which, even if a treating solution flows through a supply pipe at varied velocities in different positions transversely of the supply pipe before reaching a treating solution supply nozzle, diminish the varied flow velocities due to the positions inside the supply pipe to improve uniformity of treatment over the surface of a substrate.

A further object of the invention is to provide a substrate spin treating method and apparatus for preventing microbubbles from being formed in a treating solution supplied to and spread over the surface of a substrate, thereby eliminating the inconvenience caused by such microbubbles.

The above objects are fulfilled, according to this invention, by a substrate spin treating method for treating a substrate by supplying a treating solution to a surface of the substrate supported in a horizontal position and spun about a vertical axis. The method comprises the steps of placing a baffle in a position opposed to a discharge opening or openings of a treating solution supply nozzle and between the discharge opening and the substrate supported in horizontal posture. The treating solution is discharged from the discharge opening to the baffle while spinning the substrate, whereby the treating solution is supplied to the surface of the substrate by flowing over a surface of the baffle and falling from an edge of the baffle to the substrate, instead of falling from the discharge opening directly to the substrate.

In another aspect of the invention, there is provided a substrate spin treating apparatus for treating a substrate by supplying a treating solution to a surface of the substrate supported in horizontal posture and spun about a vertical axis, the apparatus comprising, a substrate supporting and spinning device for supporting the substrate in horizontal posture and spinning the substrate about the vertical axis, a treating solution supply nozzle having a discharge opening or openings for supplying the treating solution to the surface of the substrate placed on the substrate supporting and spinning device, and a baffle opposed to the discharge opening and disposed between the discharge opening and the substrate placed on the substrate supporting and spinning device for receiving the treating solution discharged from the discharge opening, whereby the treating solution is supplied to the surface of the substrate by flowing over a surface of the baffle and falling from an edge of the baffle to the substrate, instead of falling from the discharge opening directly to the substrate.

In the substrate spin treating method and apparatus according to this invention, the developing solution discharged through the discharge opening or openings of the developing solution supply nozzle does not fall straight to the substrate, but falls to the baffle, flows over the surface thereof and then falls from its edge to the substrate. Thus, the developing solution falls in a curtain-like form from the entire circumference of the baffle to be supplied evenly over the surface of the substrate. This diminishes an unevenness of treatment, such as developing unevenness, due to an uneven supply of the treating solution to the substrate surface. The developing solution may flow through a developing solution supply pipe at a flow rate variable transversely thereof. The variations in the flow rate due to different positions in the flow passage are diminished since the treating solution discharged from the discharge openings of the supply nozzle is supplied to the substrate after flowing over the surface of the baffle. Thus, the treatment is effected uniformly over the surface of the substrate, compared with treatment by the conventional apparatus. Further, microbubbles are formed in the treating solution colliding with the surface of the baffle after exiting the discharge openings of the supply nozzle. These microbubbles disappear through diffusion into ambient air while the treating solution flows over the surface of the baffle. There is little chance of the microbubbles remaining in the treating solution falling from the baffle to the surface of the substrate and spreading over the substrate surface. This eliminates an inconvenience such as defective development due to microbubbles.

In the above substrate spin treating apparatus, the discharge opening or openings may be defined by a plurality of bores formed in the treating solution supply nozzle. With this construction, even when the treating solution flows through the supply pipe at a flow rate variable transversely thereof, the treating solution flowing from the supply pipe into the supply nozzle is divided to flow through the plurality of bores before falling to the surface of the baffle. This diminishes variations in the flow rate of the treating solution due to different positions within the flow passage. Further, since the treating solution falls to the surface of the baffle after flowing through the small bores, there is little possibility of air mixing into the treating solution discharged from the discharge openings of the supply nozzle.

Each of the bores may have a size at least equal to a spacing between an adjacent pair of the bores. For example, the bores comprise circular bores each having a diameter at least equal to a spacing between an adjacent pair of the circular bores. With this construction, the treating solution falls from the bores (e.g. circular bores) to the surface of the baffle in the form of bars which merge into a filmy flow on the surface of the baffle. Then, the treating solution falls in a curtain-like form from the entire circumference of the baffle to be supplied over the surface of the substrate. The bores may have other shapes than circular, but circular bores have advantages such as of being easy to shape.

The circular bores may be arranged circumferentially and equidistantly about an axis extending through a center of the baffle. The baffle may have a symmetrical shape in plan view. With this construction, the treating solution falls from the circular bores evenly around the center of the baffle, and flows over the surface of the baffle symmetrical in plan view. Then, the treating solution falls evenly from the entire circumference of the baffle to be supplied over the surface of the substrate. This reliably prevents an unevenness of treatment due to an uneven supply of the treating solution to the substrate surface.

The center of the baffle may be connected to the center of a lower surface of the treating solution supply nozzle through a connector extending downward from the center of the lower surface, the circular bores defining the discharge openings of the treating solution supply nozzle being arranged around the connector (circumferentially and equidistantly). Then, the baffle may be disposed between the discharge openings of the supply nozzle and the substrate supported in horizontal posture, without affecting the flow of the treating solution supplied from the edge of the baffle to the substrate surface.

In the above construction, the discharge openings are defined by a plurality of bores (e.g. circular bores) formed in the treating solution supply nozzle. Alternatively, the discharge openings may be integrated into a slit. With this construction, the treating solution falling from the slit to the surface of the baffle flows in film form over the surface of the baffle, and falls in a curtain-like form from the entire circumference of the baffle to the substrate surface.

The slit may be divided by partitions into a plurality of sections. With this construction, even when the treating solution flows through the treating solution supply pipe at a flow rate variable transversely thereof, the treating solution flowing from the supply pipe into the supply nozzle is divided to flow through the plurality of sections before falling to the surface of the baffle. Compared with the slit not having the partitions, this construction diminishes variations in the flow rate of the treating solution through different positions within the flow passage, when the treating solution falls from the discharge openings of the supply nozzle to the surface of the baffle. Further, since the treating solution falls to the surface of the baffle after flowing through the small sections, there is little possibility of air mixing into the treating solution exiting the discharge openings of the supply nozzle.

The baffle may have a concaved bottom surface. This construction realizes improved liquid breaking at the edge of the baffle. This eliminates undesirable dripping of the treating solution onto the substrate surface, thereby avoiding an unevenness of treatment.

The discharge openings may be arranged outside a position of projection of an inner periphery of a forward end of a treating solution supply pipe connected to the treating solution supply nozzle. With this construction, the treating solution flowing from the supply pipe into the supply nozzle is once deflected outward such as by colliding with an inner surface of the bottom wall of the supply nozzle. Thereafter the treating solution falls from the discharge openings to the surface of baffle. Consequently, variations in the flow rate of the treating solution due to different positions within the supply pipe are diminished when the treating solution falls from the discharge openings of the supply nozzle to the surface of the baffle.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

Preferred embodiments of the present invention will be described in detail hereinafter with reference to the drawings.

Figure 2:
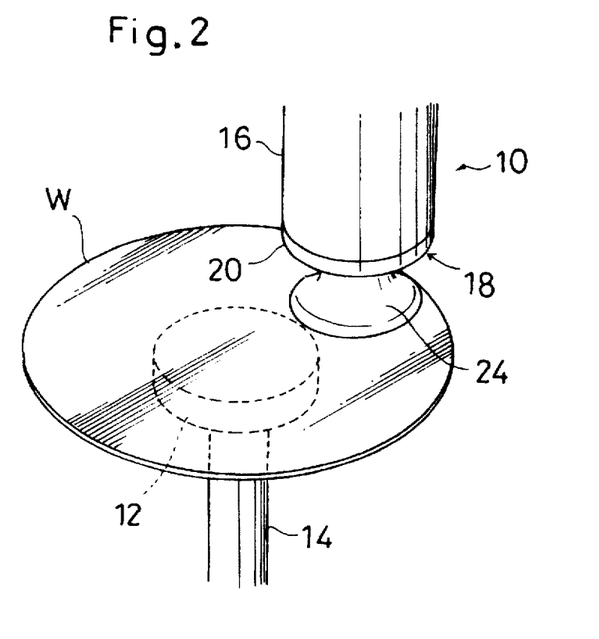
FIG. 2 is a perspective view of a portion of a spin developer which is one example of a substrate spin treating apparatus embodying the present invention.
Figure 3:
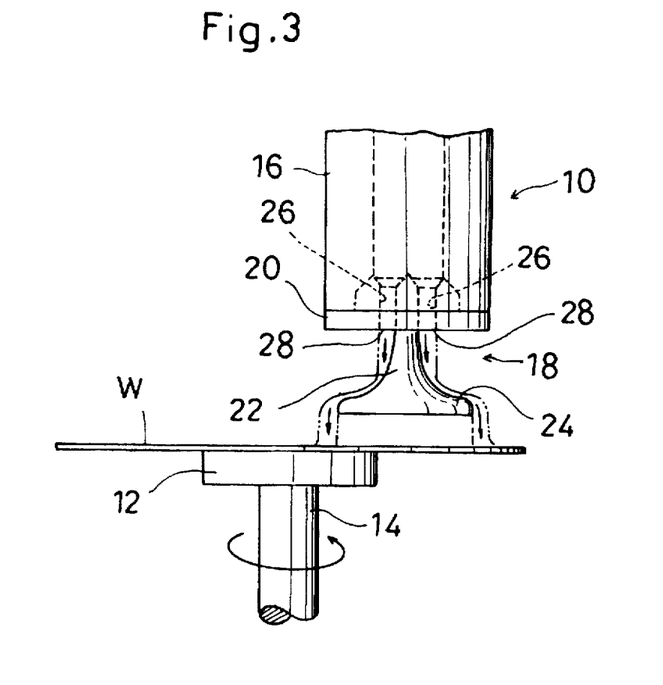
FIG. 3 is a front view of the portion of the spin developer shown in FIG. 2.

FIGS. 2 and 3 show one embodiment of this invention, in which FIG. 2 is a perspective view of a portion of a spin developer, and FIG. 3 is a front view thereof. The spin developer includes a developing solution supply nozzle 10, a spin chuck 12 for supporting a substrate or wafer W in a horizontal position, and a rotary shaft 14 for supporting the spin chuck 12. Though not shown in the drawings, the spin developer further includes a spin motor for driving the rotary shaft 14 to spin the wafer W on the spin chuck 12 about a vertical axis, a cup surrounding regions laterally of and below the wafer W placed on the spin chuck 12 for collecting developing solution scattering from the wafer W, and a nozzle moving mechanism for moving the developing solution supply nozzle 10 between a standby position outwardly of the outer edge of the wafer W placed on the spin chuck 12 and a developing solution supplying position directly over the wafer W. These unillustrated components are the same as found in a conventional spin developer, and will not be described hereinafter. The following description centers on a developing solution supplying device for supplying the developing solution to the surface of wafer W supported in a horizontal position on the spin chuck 12.

Figure 4:
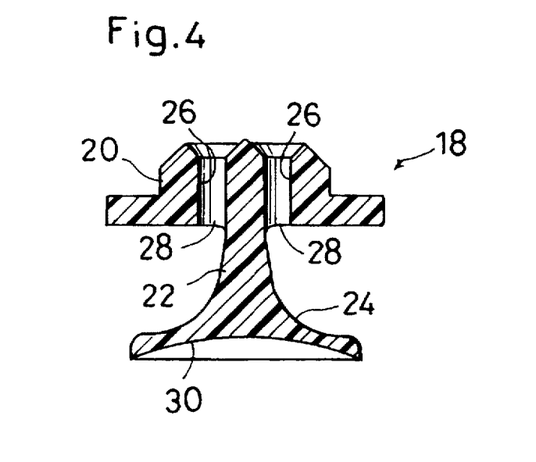
FIG. 4 is a view in vertical cross section of a developing solution downflow element forming part of a developing solution supplying device in the spin developer shown in FIG. 2.
Figure 5:
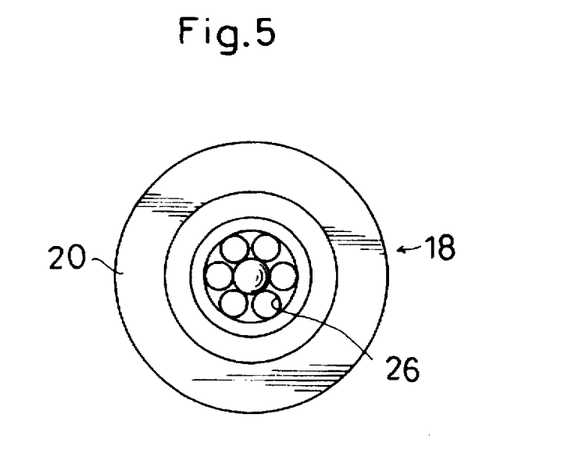
FIG. 5 is a top plan view of the developing solution downflow element.
Figure 6:
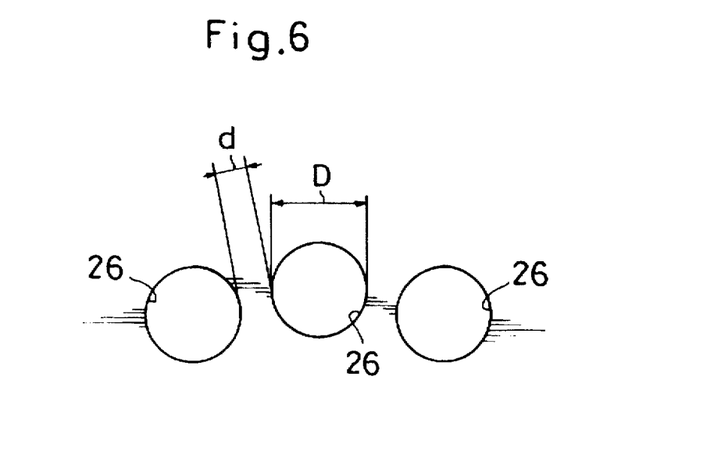
FIG. 6 is an enlarged view showing a spacing between adjacent discharge bores.

The developing solution supply nozzle 10 includes a tubular body 16 connected to a developing solution supply pipe not shown. The tubular body 16 has a developing solution downflow element 18 rigidly connected to a forward end thereof. The downflow element 18 closes an end opening of the tubular body 16. As shown in FIG. 4 which is a vertical cross sectional view and in FIG. 5 which is a top plan view, the downflow element 18 includes a plug 20 fitted in the forward end of the tubular body 16 for blocking the end opening, a stem 22 extending downward from the center of the plug 20, and a baffle 24 circular in plan view and integrated at the center thereof with the stem 22. These components of the downflow element 18 are formed of fluororesin, for example, and are integrated with one another. The plug 20 includes a plurality of discharge bores 26 arranged circumferentially and equidistantly and defining discharge openings 28 at lower ends thereof. As shown in the enlargement of FIG. 6, each discharge bore 26 has a diameter D equal to or larger than a spacing d between adjacent discharge bores 26 (D≧d). The baffle 24 is opposed to the discharge openings 28 and disposed between the discharge openings 28 and the surface of wafer W placed on the spin chuck 12. The baffle 24 has a bottom surface 30 that is concaved. The developing solution downflow element 18 is disposed above the wafer W, with the bottom surface of the baffle 24 spaced from the developing solution on the wafer W. For example, the bottom surface of the baffle 24 is at a distance of approximately 4 mm from the surface of wafer W.

With the substrate spin treating apparatus having the above construction, as shown in FIG. 3, the developing solution is discharged through the discharge openings 28 of the developing solution supply nozzle 10 at a flow rate of 0.5 to 1.5 lit/min. for example. The developing solution does not fall straight to the wafer W, but falls on the baffle 24, flows over the surface thereof and then falls from its edge to the wafer W. As noted above, the discharge bores 26 of the supply nozzle 10 are arranged circumferentially and equidistantly with spacings d not exceeding the diameter thereof, and the baffle 24 is circular in plan view. Consequently, the developing solution is discharged in an even circumferential distribution from the discharge openings 28 of the supply nozzle 10, to flow over the surface of baffle 24 in a plurality of fingers which merge into a filmy flow. The developing solution falls in an even circumferential distribution from the edge of baffle 24 to the surface of wafer W. Thus, the developing solution falls in a curtain-like form from the entire circumference of baffle 24 so as to be supplied evenly over the surface of wafer W. Microbubbles are formed in the developing solution colliding with the surface of baffle 24 after exiting the discharge openings 28 of the supply nozzle 10. These microbubbles disappear through diffusion into the ambient air while the developing solution flows over the surface of baffle 24. Consequently, no microbubbles remain in the developing solution falling from the baffle 24 to the surface of wafer W and spreading over the wafer surface. The developing solution flows through the small discharge bores 26, and falls from the discharge openings 28 to the surface of baffle 24. Thus, there is little chance of air mixing into the developing solution exiting the discharge openings 28 of supply nozzle 10.

Figure 7:
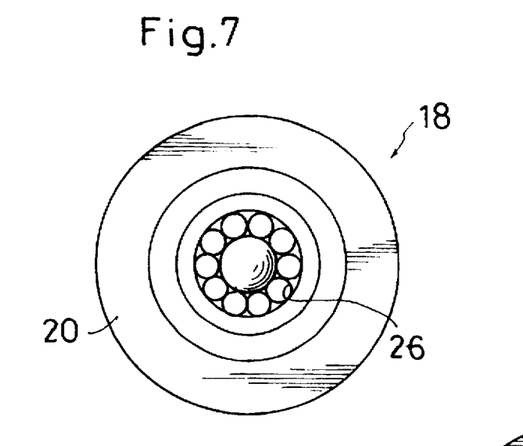
FIG. 7 is a plan view of a modified developing solution downflow element.

In the above embodiment, the discharge bores 26 are arranged with predetermined spacings in between. However, as shown in FIG. 7, the discharge bores 26 may be arranged in contact with one another.

Figure 8:
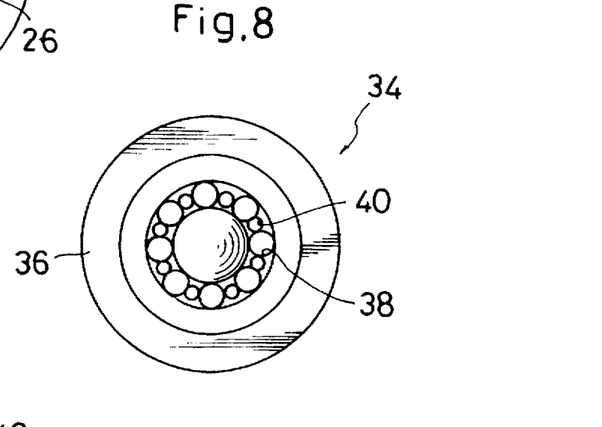
FIG. 8 is a plan view of another modified downflow element.

In the above embodiment, all of the discharge bores 26 have the same diameter. FIG. 8 shows a modified developing solution downflow element 38 including a plug 36 defining a mixture of large discharge bores 36 and small discharge bores 38.

It is not absolutely necessary to arrange the plurality of discharge bores equidistantly in the plug of the downflow element. It is also not essential to arrange the plurality of discharge bores circumferentially.

In the above embodiments, the plurality of discharge bores have a circular shape in plan view. However, the discharge bores may have a square, hexagonal or other polygonal shape in plan view.

Figure 9:
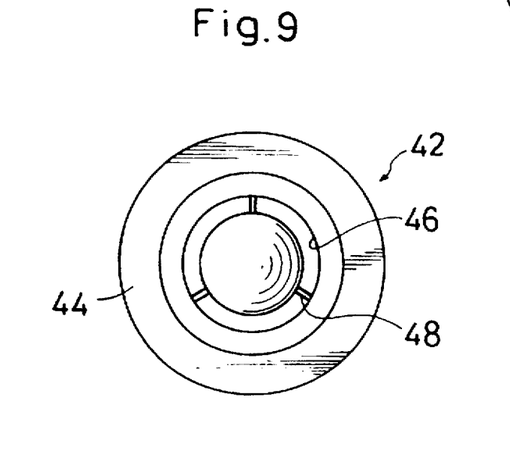
FIG. 9 is a plan view of yet another modified downflow element.

FIG. 9 shows, in plan view, another modified developing solution downflow element 42 with a plug 44 defining an annular slit 46. Numeral 48 denotes connectors for connecting the baffle to the plug 44. With a developing solution supply nozzle having downflow element 42 attached thereto, the developing solution is discharged in an even circumferential distribution from a discharge opening at the lower end of the slit 46, to flow as a film over the surface of baffle 24. Then, the developing solution falls in a curtain-like form from the entire circumference of baffle 24 to be supplied evenly over the surface of wafer W.

Figure 10:
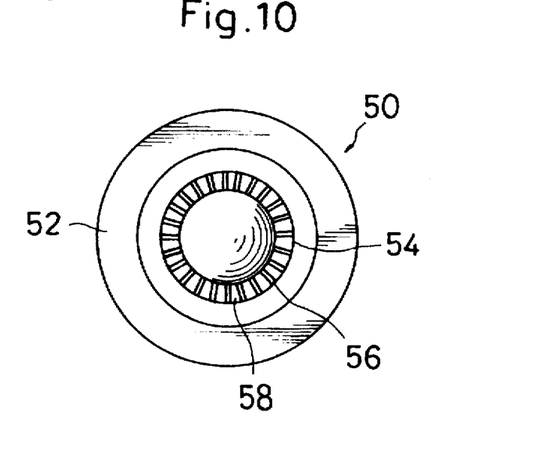
FIG. 10 is a plan view of a further modified downflow element.

FIG. 10 shows, in plan view, a further modified developing solution downflow element 50 with a plug 52 defining an annular slit 54 which is divided by partitions 56 into a plurality of sections 58. The downflow element 50 has an advantage over the downflow element 42 shown in FIG. 9 when the developing solution flows through the developing solution supply pipe at a flow rate which varies transversely thereof. With a developing solution supply nozzle having this downflow element 50 attached thereto, the developing solution flowing in from the supply pipe is divided in its flow by the plurality of sections 58 before falling to the surface of the baffle. This diminishes variations in the flow rate of the developing solution due to different positions within the flow passage. Further, since the developing solution falls to the surface of the baffle after flowing through the small sections 58, there is little possibility of air mixing into the developing solution.

In the downflow elements 42 and 50 shown in FIGS. 9 and 10, the plugs 44 and 52 define annular slits 46 and 54, respectively. It is not essential that these slits are annular. Further, the partitions may be arranged irregularly for dividing the slits in the plug of the downflow element. The sections defined by the partitions may have various other shapes than that is shown in FIG. 10.

Figure 11:
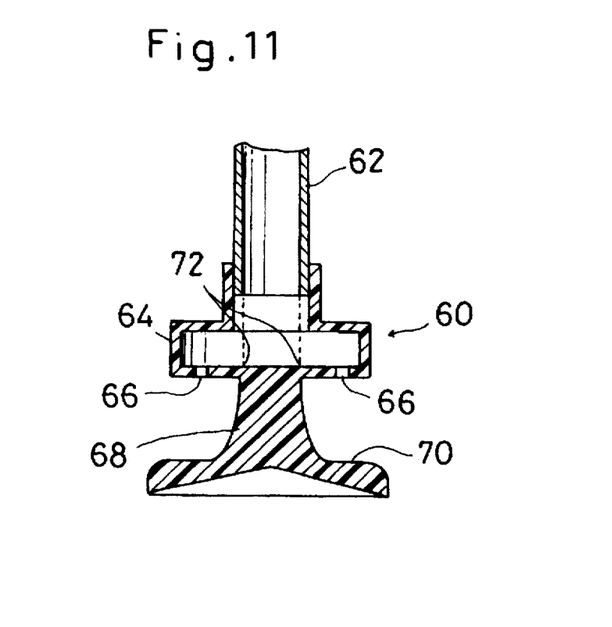
FIG. 11 is a view in vertical cross section of a developing solution supplying device of a different embodiment of the present invention.

FIG. 11 is a view in vertical cross section of another embodiment of a developing solution supplying device of a spin developer. A developing solution supply nozzle 60 includes a discharge element 64 connected to a forward end of a developing solution supply pipe 62 and having a plurality of discharge bores 66 (or an annular slit) defining discharge openings, a stem 68 extending downward from the center of a lower surface of the discharge element 64, and a baffle 70 integrated at the center thereof with the stem 68. The discharge element 64 has a lower half which is larger in diameter than its upper half. The discharge bores 66 are arranged in a bottom wall of the lower half of the discharge element 64, at a position outside of an inner peripheral edge of the forward end of the developing solution supply pipe 62.

With the supply nozzle 60 shown in FIG. 11, the developing solution flowing from the supply pipe 62 into the supply nozzle 60 collides with an inner surface of the bottom wall of the discharge element 64 to be deflected outward. Then, the developing solution flows through the discharge bores 66, and falls from the discharge openings to the surface of baffle 70. Consequently, variations in the flow rate of the developing solution through different positions within the supply pipe 62 are diminished when the developing solution falls from the discharge openings of discharge element 64 to the surface of baffle 70.

The configuration and construction of the baffle are not limited to those shown in FIGS. 2 through 5 and FIG. 11, but may be varied as appropriate.

Figure 12:
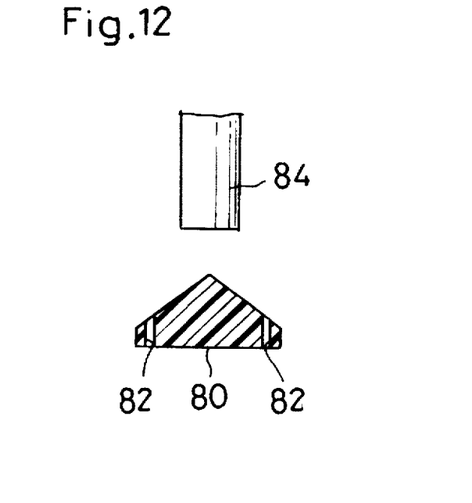
FIG. 12 is a view in vertical cross section of a baffle different from baffles shown in FIGS. 2 through 5.

FIG. 12 shows a baffle 80 having a conical overall configuration, for example. The baffle 80 has a plurality of perforations 82 extending vertically therethrough. The developing solution flows over the surface of baffle 80 and falls from the edge thereof to the wafer, while part of the developing solution flows through the perforations 82 to fall from the bottom surface to the wafer. The baffle 82 is formed separately from a developing solution supply nozzle 84.

Figure 13:
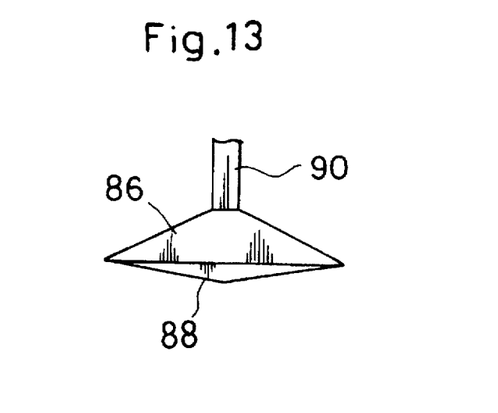
FIG. 13 is a front view of another modified baffle.

The baffle 24 described hereinbefore has the concaved bottom surface 30 for improved liquid breaking at the edge thereof. FIG. 13 shows another example of baffle 86 which has an entire bottom area defining a bulged surface 88 to improve liquid breaking. Numeral 90 in FIG. 13 denotes a stem extending from the center of a lower surface of a developing solution supply nozzle not shown.

Figure 14:
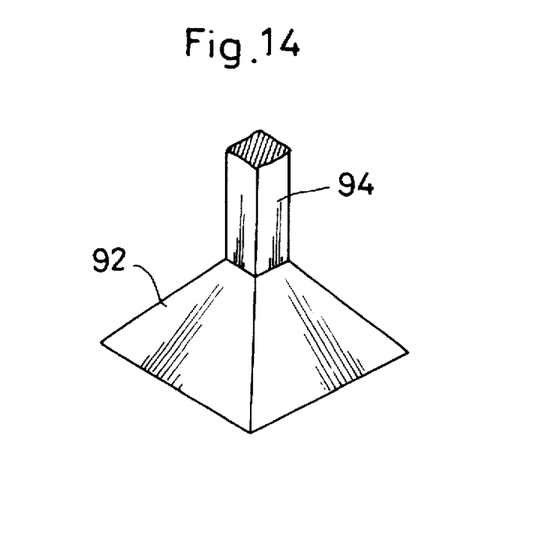
FIG. 14 is a perspective view of yet another modified baffle.

FIG. 14 shows a further example of a baffle designated by the numeral 92, which has an overall configuration of a quadrangular pyramid. Numeral 94 in FIG. 14 denotes a stem extending from the center of a lower surface of a developing solution supply nozzle not shown. Other shapes that the baffle may adopt include a triangular pyramid, a hexagonal pyramid and other polygonal pyramids.

Figure 17:
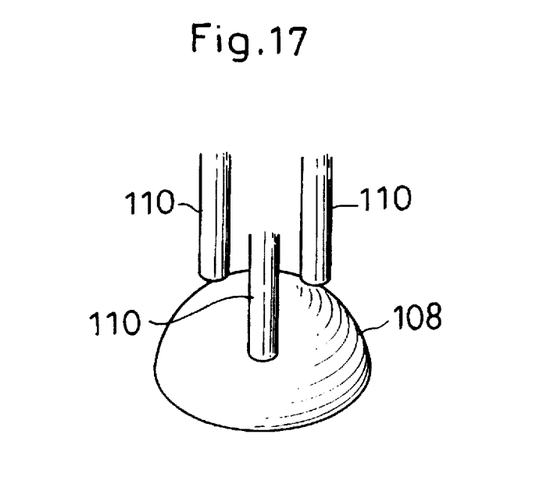
FIG. 17 is a perspective view of a developing solution supply nozzle and a baffle different from those shown in FIGS. 2 through 5.

FIG. 17 shows a hemispherical baffle 108, but the baffle may have a spherical or ellipsoidal shape, instead.

Figure 15:
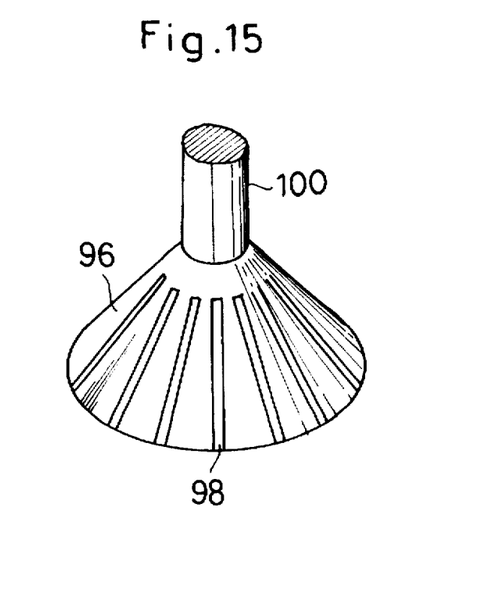
FIG. 15 is a perspective view of a further modified baffle.

The baffle 96 shown in FIG. 15 has a surface defining a plurality of grooves 98 extending radially outward and arranged circumferentially and equidistantly. With respect to baffle 96, the developing solution falling from discharge openings of a supply nozzle, not shown, flows radially outward by the guiding action of the grooves 98, and falls in an even circumferential distribution from the edge of baffle 96 to the wafer surface.

Figure 16:
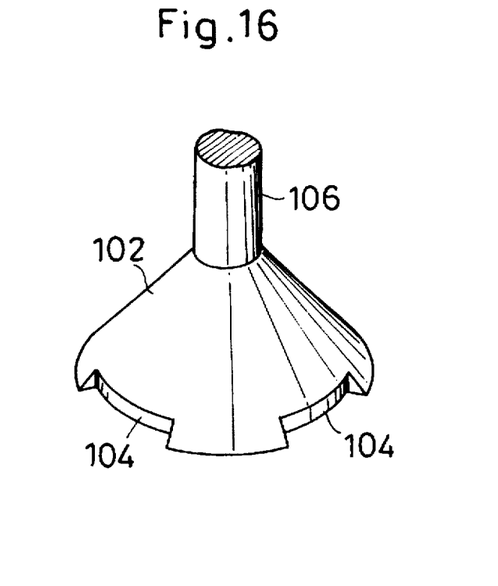
FIG. 16 is a perspective view of a still further modified baffle.

The baffle 102 shown in FIG. 16 has a plurality about cutouts 104 arranged equidistantly and circumferentially of the edge thereof. Cutouts 104 prevent deviating flows of the developing solution falling from the discharge openings of the supply nozzle. Thus, the developing solution falls in an even circumferential distribution from the edge of baffle 102 to the wafer surface. Numerals 100 and 106 in FIGS. 15 and 16 denote stems which extending from the center of the lower surface of the developing solution supply nozzle.

In the substrate spin treating apparatus heretofore described, the single developing solution supply nozzle 10 has a plurality of discharge openings 28 arranged circumferentially and equidistantly in the lower surface thereof. FIG. 17 shows three developing solution supply nozzles 110 evenly distributed over the hemispherical baffle 103.

Figure 18:
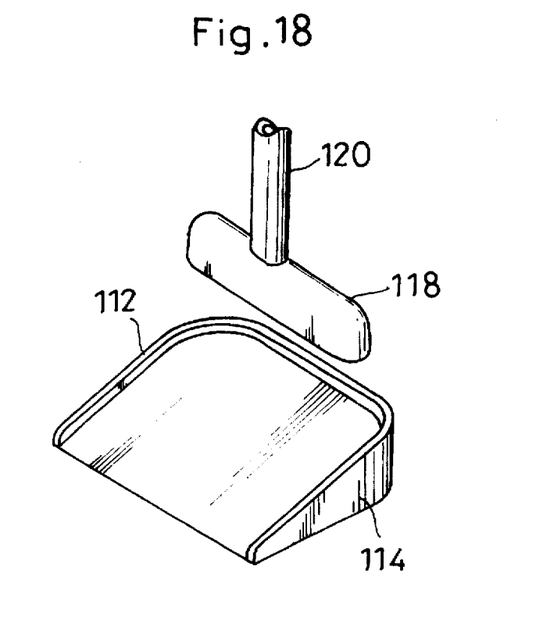
FIG. 18 is a perspective view of another modified developing solution supply nozzle and modified baffle.

Further, FIG. 18 shows a baffle 114 in the form of a plate having an inclined surface, with a frame 112 surrounding the surface at three sides thereof. A developing solution supply nozzle 118 extends over the baffle 114 in a direction perpendicular to a direction of inclination of the plate surface. The supply nozzle 118 may have a lower surface defining a plurality of discharge openings arranged equidistantly and longitudinally thereof, or a discharge slit extending longitudinally thereof. A developing solution flowing from a developing solution supply pipe 120 into the supply nozzle 118 is discharged through the discharge openings or discharge slit down to the inclined surface of baffle 114. In this case, it is necessary to set a forward edge of baffle 114 to a radial direction of the wafer supported on the spin chuck. With this construction, the developing solution discharged from the discharge openings of supply nozzle 118 down to the baffle 114 flows down the inclined surface, and falls from the forward edge thereof to the wafer. The inclined surface of baffle 114 may define a plurality of grooves arranged equidistantly and extending in the direction of inclination. Such grooves will enhance an even distribution of flows of the developing solution in the direction perpendicular to the direction of inclination.

The developing solution supply nozzle and baffle may stand still when supplying the developing solution to the wafer, or may supply the developing solution to the surface of the wafer while moving along the wafer surface.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin treating apparatus for treating a substrate by supplying a treating solution to a surface of the substrate supported in a horizontal position and spun about a vertical axis, said apparatus comprising:

substrate supporting and spinning means for supporting said substrate in a horizontal position and spinning said substrate about said vertical axis;

a treating solution supply nozzle having discharge opening means for discharging said treating solution; and baffle means opposed to said discharge opening means and disposed between said discharge opening means and said substrate for receiving said treating solution discharged from said discharge opening means, a center of said baffle means is connected to a center of a lower surface of said treating solution supply nozzle through a connector extending downward from said center of said lower surface, said discharge opening means of said treating solution supply nozzle being arranged around said connector;

whereby said treating solution is supplied to said surface of said substrate by flowing over a surface of said baffle means and falling from said baffle means to said substrate, instead of being supplied from said discharge opening means directly to said substrate.

2. A substrate spin treating apparatus as defined in claim 1, wherein said discharge opening means is defined by a plurality of bores formed in said treating solution supply nozzle.

3. A substrate spin treating apparatus as defined in claim 2, wherein each of said bores has a bore size at least equal to or greater than a spacing between it and an adjacent bore.

4. A substrate spin treating apparatus as defined in claim 3, wherein said bores comprise circular bores each having a diameter at least equal to a spacing between an adjacent pair of said circular bores.

5. A substrate spin treating apparatus as defined in claim 4, wherein said circular bores are arranged circumferentially and equidistantly about an axis extending through a center of said baffle means.

6. A substrate spin treating apparatus as defined in claim 5, wherein said baffle means has a symmetrical shape.

7. A substrate spin treating apparatus as defined in claim 1, wherein said discharge opening means is defined by a slit.

8. A substrate spin treating apparatus as defined in claim 7, wherein said slit is divided by partitions into a plurality of sections.

9. A substrate spin treating apparatus as defined in claim 1, wherein said baffle means has a concaved bottom surface.

10. A substrate spin treating apparatus as defined in claim 1, wherein said discharge opening means is disposed at a position outside of an inner periphery of an end of a treating solution supply pipe connected to said treating solution supply nozzle.

11. A substrate spin treating apparatus for treating a substrate by supplying a treating solution to a surface of the substrate supported in a horizontal position and spun about a vertical axis, said apparatus comprising:

substrate supporting and spinning means for supporting said substrate in a horizontal position and spinning said substrate about said vertical axis;

a treating solution supply nozzle having discharge opening means for discharging said treating solution; and baffle means opposed to said discharge opening means and disposed between said discharge opening means and said substrate for receiving said treating solution discharged from said discharge opening means, a portion of said baffle means surrounded by said discharge opening means;

whereby said treating solution is supplied to said surface of said substrate by flowing over a surface of said baffle means and falling from said baffle means to said substrate, instead of being supplied from said discharge opening means directly to said substrate.

12. A substrate spin treating apparatus for treating a substrate by supplying a treating solution to a surface of the substrate supported in a horizontal position and spun about a vertical axis, said apparatus comprising:

substrate supporting and spinning means for supporting said substrate in a horizontal position and spinning said substrate about said vertical axis;

a treating solution supply nozzle having discharge opening means for discharging said treating solution, said discharge opening means being a plurality of bores in said treating solution supply nozzle; and baffle means opposed to said discharge opening means and disposed between said discharge opening means and said substrate for receiving said treating solution discharged from said discharge opening means;

whereby said treating solution is supplied to said surface of said substrate by flowing over a surface of said baffle means and falling from said baffle means to said substrate, instead of being supplied from said discharge opening means directly to said substrate.

13. A substrate spin treating apparatus for treating a substrate by supplying a treating solution to a surface of the substrate supported in a horizontal position and spun about a vertical axis, said apparatus comprising:

substrate supporting and spinning means for supporting said substrate in a horizontal position and spinning said substrate about said vertical axis;

a treating solution supply nozzle having discharge opening means for discharging said treating solution, said discharge opening means is a slit divided by partitions into a plurality of sections; and baffle means opposed to said discharge opening means and disposed between said discharge opening means and said substrate for receiving said treating solution discharged from said discharge opening means;

whereby said treating solution is supplied to said surface of said substrate by flowing over a surface of said baffle means and falling from said baffle means to said substrate, instead of being supplied from said discharge opening means directly to said substrate.

* * * * *